US012771324B2

(12) United States Patent
Noguchi

(10) Patent No.: US 12,771,324 B2
(45) Date of Patent: Oct. 20, 2026

(54) ACOUSTIC WAVE DEVICE AND MULTIPLEXER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 126 days.

(21) Appl. No.: 18/813,244

(22) Filed: Aug. 23, 2024

(65) Prior Publication Data

US 2025/0096777 A1 Mar. 20, 2025

(30) Foreign Application Priority Data

Sep. 19, 2023 (JP) ................................ 2023-151557

(51) Int. Cl.

| | |
|---|---|
| ***H03H 9/64*** | (2006.01) |
| ***H03H 9/02*** | (2006.01) |
| ***H03H 9/72*** | (2006.01) |
| *H03H 3/04* | (2006.01) |

(52) U.S. Cl.

CPC ...... *H03H 9/6489* (2013.01); *H03H 9/02015* (2013.01); *H03H 9/02228* (2013.01); *H03H 9/6483* (2013.01); *H03H 9/725* (2013.01); *H03H 2003/0421* (2013.01); *H03H 2003/0428* (2013.01); *H03H 2003/0435* (2013.01)

(58) Field of Classification Search

CPC ............. H03H 9/6489; H03H 9/02015; H03H 9/02228; H03H 9/6483; H03H 9/725; H03H 2003/0421; H03H 2003/0428; H03H 2003/0435

USPC ............................... 310/313 R; 333/186, 193

See application file for complete search history.

(56) References Cited

U.S. PATENT DOCUMENTS

| | | | | |
|---|---|---|---|---|
| 2007/0007852 | A1* | 1/2007 | Kando | H03H 9/0222 310/313 B |
| 2016/0294361 | A1 | 10/2016 | Yamane et al. | |
| 2020/0091894 | A1 | 3/2020 | Nakahashi | |
| 2023/0208382 | A1* | 6/2023 | Nagatomo | H03H 9/02031 310/348 |

FOREIGN PATENT DOCUMENTS

| | | |
|---|---|---|
| JP | 2020048067 A | 3/2020 |
| WO | 2015098756 A1 | 7/2015 |

* cited by examiner

*Primary Examiner* — Andrea Lindgren Baltzell
*Assistant Examiner* — Victor Cole
(74) *Attorney, Agent, or Firm* — Keating & Bennett, LLP

(57) ABSTRACT

A filter includes acoustic wave resonators connected to a path connecting terminals. A substrate includes a laminated structure of a piezoelectric film, and low and high acoustic velocity films. An electrode finger wavelength of the IDT electrode is λ (m), a film thickness of the piezoelectric film is t1 (m), a film thickness of electrode fingers is t2 (m), t1/A is a film thickness-wavelength ratio A of the piezoelectric film, t2/A is a film thickness-wavelength ratio B of the plurality of electrode fingers, a density of the piezoelectric film is x (g/cm$^3$) and a density of the IDT electrode is y (g/cm$^3$), and (A/x+B/y) is a mass coefficient M of an acoustic wave resonator which is connected closest to the terminal and equal to or more than about 0.95×0.054 and equal to or less than about 1.05×0.054.

14 Claims, 5 Drawing Sheets

ACOUSTIC WAVE DEVICE AND MULTIPLEXER

CROSS REFERENCE TO RELATED APPLICATIONS

This application claims the benefit of priority to Japanese Patent Application No. 2023-151557, filed on Sep. 19, 2023. The entire contents of this application are hereby incorporated herein by reference.

BACKGROUND OF THE INVENTION

1. Field of the Invention

The present invention relates to acoustic wave devices and multiplexers.

2. Description of the Related Art

International Publication No. WO 2015/098756 and Japanese Unexamined Patent Application Publication No. 2020-48067 disclose an electrode structure of a surface acoustic wave resonator using a substrate that includes a piezoelectric film, a low acoustic velocity film, and a high acoustic velocity film, and a laminated structure of the substrate. The surface acoustic wave resonator can increase the Q value at a resonant frequency and an anti-resonant frequency, as compared to a surface acoustic wave resonator using a single-layer piezoelectric substrate.

However, in the surface acoustic wave resonator disclosed in International Publication No. WO 2015/098756 and Japanese Unexamined Patent Application Publication No. 2020-48067, the suppression of unnecessary waves (third harmonic excitation) generated at a frequency three times that of the fundamental wave is insufficient.

SUMMARY OF THE INVENTION

Example embodiments of the present invention provide acoustic wave devices and multiplexers in each of which generation of an unnecessary wave of third harmonic excitation is reduced or prevented.

According to an example embodiment of the present invention, an acoustic wave device includes a first input/output terminal and a second input/output terminal, and a plurality of acoustic wave resonators connected to a path connecting the first input/output terminal and the second input/output terminal. Each of the plurality of acoustic wave resonators includes an interdigital transducer (IDT) electrode located on a substrate having piezoelectricity. The substrate includes a piezoelectric film on a surface of which the IDT electrode is formed, a high acoustic velocity film in which an acoustic velocity of a bulk wave propagating in the high acoustic velocity film is higher than an acoustic velocity of an acoustic wave propagating in the piezoelectric film, and a low acoustic velocity film in which an acoustic velocity of a bulk wave propagating in the low acoustic velocity film is lower than an acoustic velocity of a bulk wave propagating in the piezoelectric film, the low acoustic velocity film being located between the high acoustic velocity film and the piezoelectric film. In a case where an electrode finger wavelength that is twice a pitch between a plurality of electrode fingers parallel to each other in the IDT electrode is denoted by λ (m), a film thickness of the piezoelectric film is denoted by t1 (m), a film thickness of the plurality of electrode fingers is denoted by t2 (m), t1/λ is denoted by a film thickness-wavelength ratio A of the piezoelectric film, t2/λ is denoted by a film thickness-wavelength ratio B of the plurality of electrode fingers, a density of the piezoelectric film is denoted by x (g/cm$^3$), a density of the IDT electrode is denoted by y (g/cm$^3$), and (A/x+B/y) is denoted by a mass coefficient M, a mass coefficient M of an acoustic wave resonator connected closest to the first input/output terminal among the plurality of acoustic wave resonators is equal to or more than about 0.95×0.054 and equal to or less than about 1.05×0.054.

According to example embodiments of the present invention, it is possible to provide acoustic wave devices and multiplexers in each of which generation of unnecessary waves due to third harmonic excitation is reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
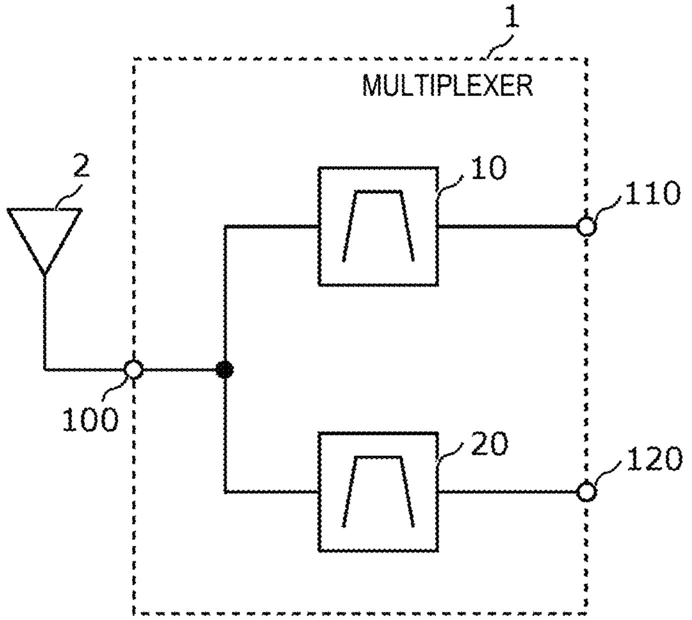
FIG. 1 is a circuit configuration diagram of a multiplexer according to an example embodiment of the present invention.

Hereinafter, example embodiments of the present invention will be described in detail with reference to the drawings. All of the example embodiments described below describe comprehensive or specific examples. Numerical values, shapes, materials, elements, a disposition and a connection configuration of the elements, and the like illustrated in the following example embodiments are merely examples and not intended to limit the present invention.

Each drawing is a schematic view in which emphasis, omission, or ratio adjustment is made as appropriate to represent the present invention, and is not necessarily illustrated strictly. In some cases, a shape, a positional relationship, and a ratio may be different from actual ones. In the drawings, the same or substantially same configurations are denoted by the same reference signs, and repeated description thereof may be omitted or simplified in some cases.

In a circuit configuration of the present disclosure, the phrase "connected between A and B" or "being connected between A and B" means both being connected between A and B and being connected to both of A and B.

In addition, in a component disposition of the present disclosure, the phrase "a component A is provided in series in a path B" means that both a signal input end and a signal output end of the component A are connected to a wire, an electrode, or a terminal forming the path B.

In addition, terms representing a relationship between elements such as "parallel" and "perpendicular", terms representing a shape of an element such as "rectangular", and a numerical range not only represent strict meanings, but also mean a substantially equivalent range, for example, that an error of approximately several percent is included.

In addition, in the present disclosure, the term "terminal" means a point where a conductor in an element ends. In a case where an impedance of the conductor between the elements is sufficiently low, the terminal is interpreted as not only a single point but also any point on the conductor between the elements or the entire conductor.

In addition, in the following example embodiment, a pass band of an acoustic wave device or a filter is defined as a frequency band between two frequencies which are, for example, about 3 dB higher from a minimum value of an insertion loss in the pass band.

In addition, in the present disclosure, a band A and a band B mean a frequency band defined in advance by a standardization group or the like (for example, 3GPP (registered trademark) and the Institute of Electrical and Electronics Engineers (IEEE)) for a communication system constructed by using a radio access technology (RAT). In the present example embodiment, as the communication system, for example, a long term evolution (LTE) system, 5th generation (5G)-new radio (NR) system, a wireless local area network (WLAN) system, and the like can be used, but the present invention is not limited thereto.

In addition, an uplink operation band of the band A means a frequency range designated for uplink in the band A. In addition, a downlink operation band of the band A means a frequency range designated for downlink in the band A.

Example Embodiment

1. Circuit Configuration of Multiplexer

FIG. 1 is a circuit configuration diagram of a multiplexer 1 according to an example embodiment of the present invention. The multiplexer 1 includes filters 10 and 20, a common terminal 100, and input/output terminals 110 and 120.

The common terminal 100 is connected to, for example, an antenna 2.

The filter 10 is an example of an acoustic wave device, is connected to the common terminal 100, and has a pass band including an uplink operation band of a band A, for example. The filter 20 is connected to the common terminal 100 and has a pass band including a downlink operation band of the band A, for example. The filters 10 and 20 define, for example, a duplexer for the band A.

The filter 10 may have a pass band including at least one of the uplink operation band and the downlink operation band of the band A, and the filter 20 may have a pass band including at least one of an uplink operation band and a downlink operation band of a band B different from the band A. In this case, the filters 10 and 20 define a diplexer.

In the present example embodiment, the pass band of the filter 10 is located on a low frequency side from the pass band of the filter 20. In at least one of a plurality of acoustic wave resonators defining the filter 10, a mass coefficient M to be described later is, for example, preferably equal to or more than about 0.95×0.054 and equal to or less than about 1.05×0.054, thus making it possible to reduce unnecessary waves of the third harmonic excitation. Thus, even though the unnecessary waves of the third harmonic excitation generated by the filter 10 are included in the vicinity of the pass band of the filter 20, it is possible to reduce or prevent the deterioration in the bandpass characteristic of the filter 20.

The pass band of the filter 10 may be located on a higher frequency side from the pass band of the filter 20.

Figure 2A:
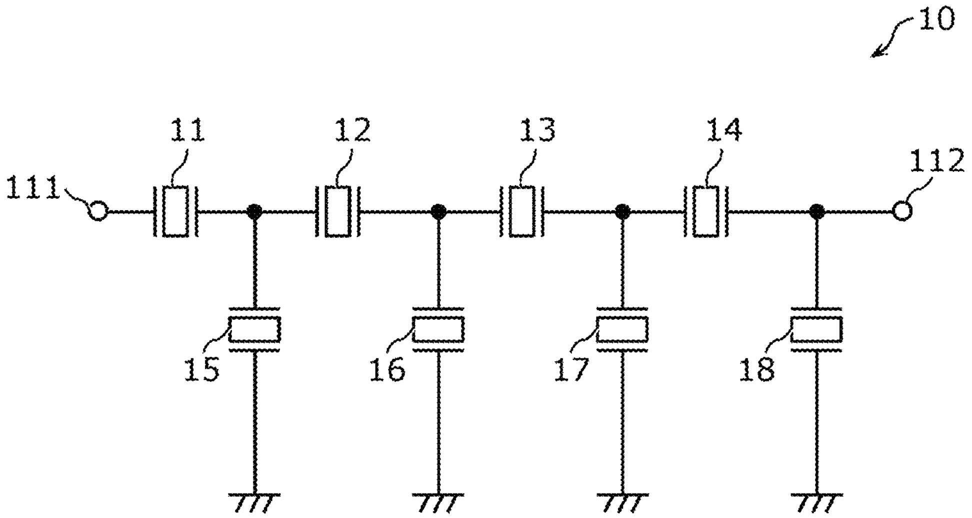
FIG. 2A is a circuit configuration diagram of an acoustic wave device according to the example embodiment of the present invention.

FIG. 2A is a circuit configuration diagram of the filter 10 according to the present example embodiment. As illustrated in FIG. 2A, the filter 10 includes series arm resonators 11, 12, 13, and 14, parallel arm resonators 15, 16, 17, and 18, and terminals 111 and 112.

The terminal 111 is an example of a first input/output terminal and is connected to the common terminal 100. The terminal 112 is an example of a second input/output terminal and is connected to the input/output terminal 110. Each of the series arm resonators 11 to 14 is an acoustic wave resonator and is provided in series in a path connecting the terminal 111 and the terminal 112. The parallel arm resonator 15 is an acoustic wave resonator and is connected between a node of the series arm resonators 11 and 12 and the ground. The parallel arm resonator 16 is an acoustic wave resonator and is connected between a node of the series arm resonators 12 and 13 and the ground. The parallel arm resonator 17 is an acoustic wave resonator and is connected between a node of the series arm resonators 13 and 14 and the ground. The parallel arm resonator 18 is an acoustic wave resonator and is connected between a node of the series arm resonator 14 and the terminal 112, and the ground. With the above configuration, the filter 10 defines, for example, a ladder band pass filter.

Each of the series arm resonators 11 to 14 and the parallel arm resonators 15 to 18 includes, for example, an IDT electrode located on a substrate having piezoelectricity.

The circuit configuration of the filter 10 illustrated in FIG. 2A is an example, and the number of series arm resonators and the number of parallel arm resonators are not limited to four each. It is sufficient that the number of series arm resonators and the number of parallel arm resonators be each one or more. In addition, an inductor may be connected between the parallel arm resonator and the ground.

Figure 2B:
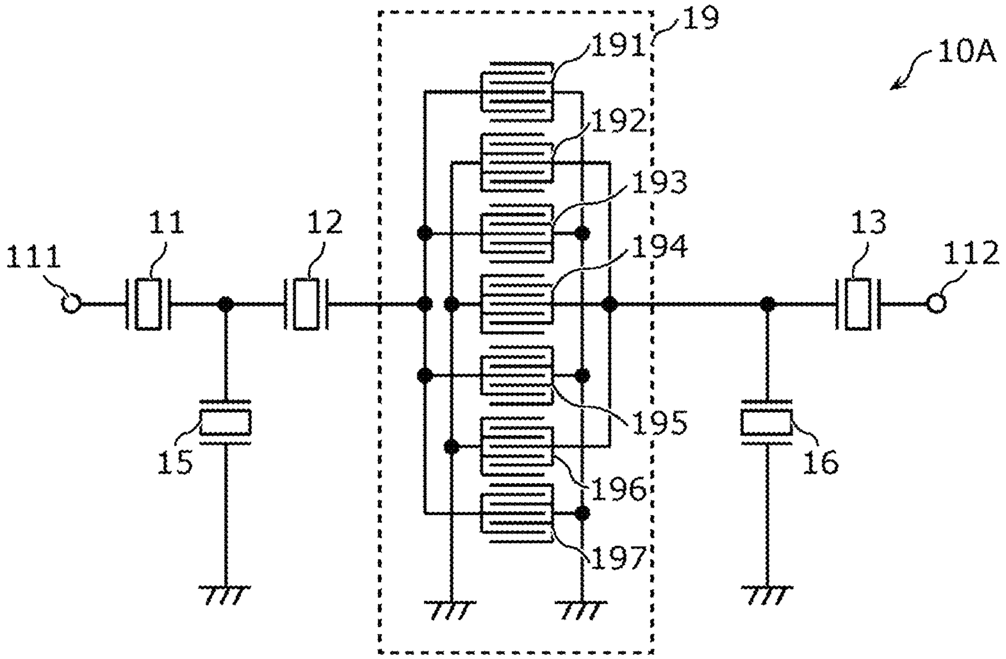
FIG. 2B is a circuit configuration diagram of an acoustic wave device according to a modified example of the example embodiment of the present invention.

In addition, the filter 10 is not limited to a ladder band pass filter, and may be, for example, a filter including a longitudinally coupled resonator in which a plurality of acoustic wave resonators are juxtaposed in an acoustic wave propagation direction, as illustrated in FIG. 2B.

FIG. 2B is a circuit configuration diagram of a filter 10A according to a modified example of the present example embodiment. The filter 10A is an example of an acoustic wave device and is connected to a common terminal 100. As illustrated in FIG. 2B, the filter 10A is a filter circuit including a longitudinally coupled resonator 19 including seven acoustic wave resonators, and including the longitudinally coupled resonator 19, series arm resonators 11, 12, and 13, parallel arm resonators 15 and 16, and terminals 111 and 112. The terminal 111 is connected to the common terminal 100, and the terminal 112 is connected to an input/output terminal 120.

The longitudinally coupled resonator 19 includes acoustic wave resonators 191, 192, 193, 194, 195, 196, and 197. One end of the longitudinally coupled resonator 19 is connected to the terminal 111 through the series arm resonators 11 and 12, and the other end of the longitudinally coupled resonator 19 is connected to the terminal 112 through the series arm resonator 13.

Each of the acoustic wave resonators 191 to 197 includes an IDT electrode located on a substrate having piezoelectricity. Each of the IDT electrodes of the acoustic wave resonators 191 to 197 is configured by two comb electrodes opposing each other. One comb electrode of each of the acoustic wave resonators 191, 193, 195, and 197 is connected to the terminal 111 through the series arm resonators 11 and 12, and the other comb electrode of each of the acoustic wave resonators 191, 193, 195, and 197 is connected to the ground. One comb electrode of each of the acoustic wave resonators 192, 194, and 196 is connected to the terminal 112 through the series arm resonator 13, and the other comb electrode of each of the acoustic wave resonators 192, 194, and 196 is connected to the ground. The acoustic wave resonators 191 to 197 are disposed along the acoustic wave propagation direction in order of the acoustic wave resonators 191, 192, 193, 194, 195, 196, and 197.

The series arm resonators 11, 12, and 13 are provided in series in a path connecting the terminals 111 and 112. Each of the parallel arm resonators 15 and 16 is connected between the path and the ground.

The filter 20 may be any of a band pass filter, a low pass filter, and a high pass filter, and includes at least one of an acoustic wave resonator, an inductor, and a capacitor, for example.

In a case where the filter 20 includes an acoustic wave resonator, the filters 10 and 20 may be provided on the same piezoelectric substrate. Accordingly, it is possible to reduce the size of the multiplexer 1 and to simplify the manufacturing process.

In addition, in a case where the filter 20 includes the acoustic wave resonator, the film thickness of the IDT electrode of the acoustic wave resonator may be the same or substantially the same as the film thickness of the IDT electrode of the acoustic wave resonator defining the filter 10. Accordingly, it is possible to simplify the manufacturing process of the multiplexer 1.

2. Structure of Acoustic Wave Resonator

Figure 3:
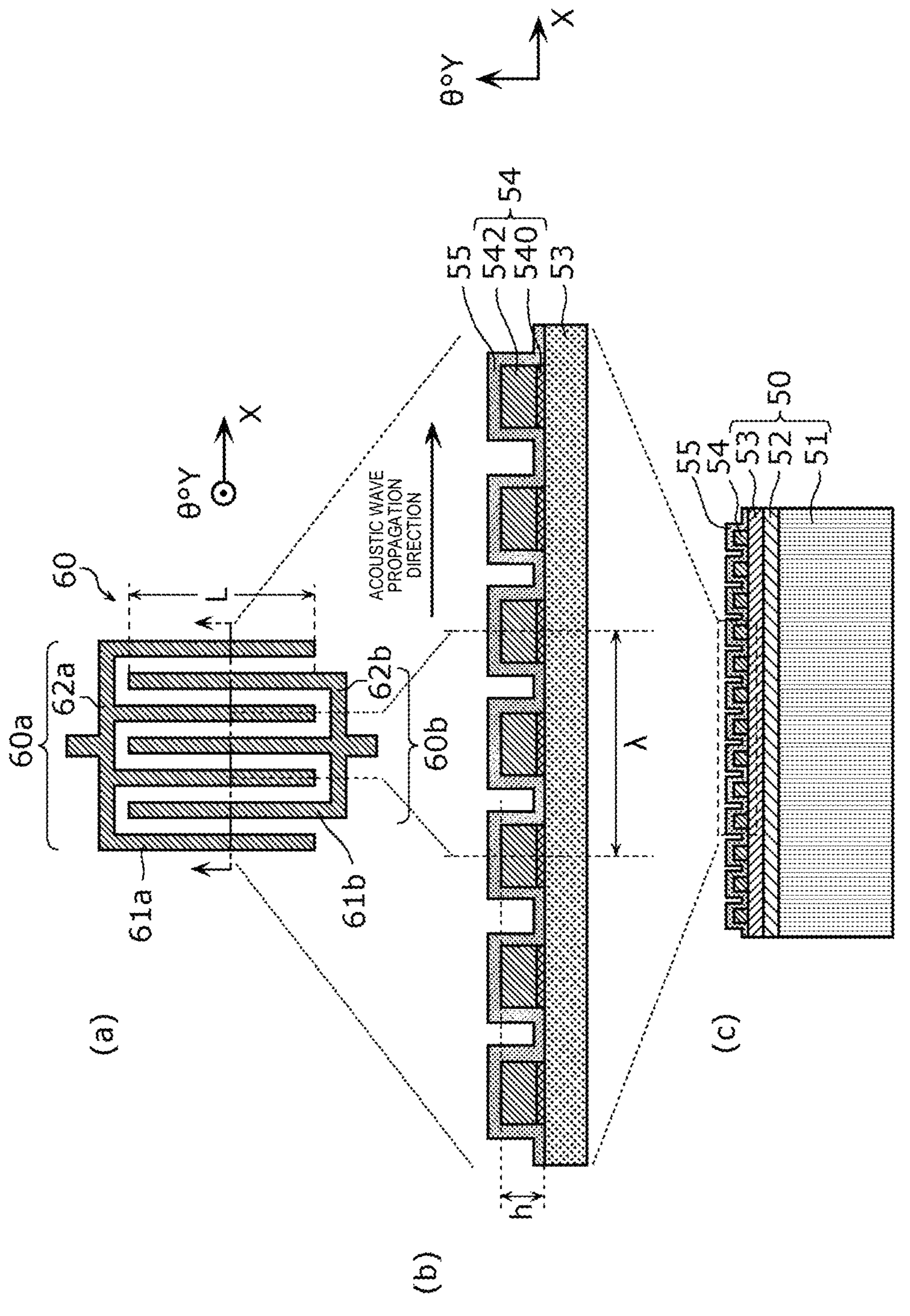
FIG. 3 includes a plan view and sectional views schematically illustrating an acoustic wave resonator according to the example embodiment of the present invention.

Next, the basic structure of each series arm resonator and each parallel arm resonator of the filter 10 will be described. FIG. 3 includes a plan view and sectional views schematically illustrating the acoustic wave resonator according to the present example embodiment. FIG. 3 illustrates a basic structure of the acoustic wave resonator of the filter 10. An acoustic wave resonator 60 illustrated in FIG. 3 is provided to describe a typical structure of the acoustic wave resonator defining the filter 10, and the number, the length, and the like of electrode fingers defining the electrode are not limited thereto.

The acoustic wave resonator 60 includes a piezoelectric substrate 50 and comb electrodes 60*a* and 60*b*. As illustrated in (a) of FIG. 3, a pair of the comb electrodes 60*a* and 60*b* opposing each other are provided on the piezoelectric substrate 50. The comb electrode 60*a* is configured by a plurality of electrode fingers 61*a* parallel or substantially parallel to each other, and a busbar electrode 62*a* that connects one ends in the plurality of electrode fingers 61*a* to each other. In addition, the comb electrode 60*b* includes a plurality of electrode fingers 61*b* parallel or substantially parallel to each other, and a busbar electrode 62*b* that connects one ends in the plurality of electrode fingers 61*b* to each other. The pluralities of electrode fingers 61*a* and 61*b* are provided along a direction perpendicular or substantially perpendicular to the acoustic wave propagation direction (X-axis direction). The busbar electrode 62*a* and the busbar electrode 62*b* are disposed to face each other with the electrode fingers 61*a* and 61*b* interposed therebetween. The comb electrodes 60*a* and 60*b* define an IDT electrode 54.

The acoustic wave resonator 60 may include reflectors at both ends of the IDT electrode 54 in the acoustic wave propagation direction (X-axis direction).

As illustrated in (b) of FIG. 3, for example, the IDT electrode 54 has a laminated structure of an adhesion layer 540 and a main electrode layer 542.

The adhesion layer 540 is a layer to improve adhesiveness between the piezoelectric substrate 50 and the main electrode layer 542, and, for example, Ti is used as a material thereof. As a material of the main electrode layer 542, for example, Al including Cu in an amount of about 1% is used. A protection layer 55 covers the comb electrodes 60*a* and 60*b*. The protection layer 55 is a layer, for example, to protect the main electrode layer 542 from the outside environment, to adjust frequency-temperature characteristics, and to improve humidity resistance. The protection layer 55 is, for example, a dielectric film including silicon dioxide as a main component.

Materials of the adhesion layer 540, the main electrode layer 542, and the protection layer 55 are not limited to the above-described materials. Furthermore, the IDT electrode 54 does not have the laminated structure described above. For example, the IDT electrode 54 may be made of metal such as Ti, Al, Cu, Pt, Au, Ag, and Pd, or an alloy, or may include a plurality of multilayer bodies made of the metal or the alloy described above. In addition, the protection layer 55 is not necessarily provided.

Next, the laminated structure of the piezoelectric substrate 50 will be described. As illustrated in (c) of FIG. 3, the piezoelectric substrate 50 includes a high acoustic velocity support substrate 51, a low acoustic velocity film 52, and a piezoelectric film 53, and includes a structure in which the high acoustic velocity support substrate 51, the low acoustic velocity film 52, and the piezoelectric film 53 are laminated in this order.

For example, the piezoelectric film 53 is made of a θ° Y-cut X propagation $LiTaO_3$ piezoelectric single crystal or piezoelectric ceramics (single crystal or ceramics in which the surface acoustic wave propagates in an X-axis direction, and which is lithium tantalate single crystal or ceramics cut by a plane in which the X-axis is set as a central axis, and an axis rotated by θ° from the Y-axis is set as a normal line). A material and a cut-angle θ of the piezoelectric single crystal used as the piezoelectric film 53 are appropriately selected depending on required specifications of each filter.

The high acoustic velocity support substrate 51 supports the low acoustic velocity film 52, the piezoelectric film 53, and the IDT electrode 54. The high acoustic velocity support substrate 51 is an example of the high acoustic velocity film and is a substrate in which the acoustic velocity of the bulk wave in the high acoustic velocity support substrate 51 is higher than the acoustic velocity of the acoustic wave such as a surface acoustic wave or a boundary acoustic wave propagating in the piezoelectric film 53. The high acoustic velocity support substrate 51 functions to prevent a surface acoustic wave from leaking down from the high acoustic velocity support substrate 51 by confining the surface acoustic wave in a portion in which the piezoelectric film 53 and the low acoustic velocity film 52 are laminated. As a material of the high acoustic velocity support substrate 51, for example, a piezoelectric body such as aluminum nitride, lithium tantalate, lithium niobate, and quartz, ceramic such as alumina, sapphire, magnesia, silicon nitride, silicon carbide, zirconia, cordierite, mullite, steatite, forsterite, spinel, and sialon, a dielectric such as aluminum oxide, silicon oxynitride, diamond-like carbon (DLC), and diamond, or a semiconductor such as silicon, and alternatively, a material that includes the above-described materials as the main components can be used. The above-described spinel includes, for example, an aluminum compound including one or more elements selected from Mg, Fe, Zn, and Mn, oxygen, and the like. Examples of the above-described spinel can include $MgAl_2O_4$, $FeAl_2O_4$, $ZnAl_2O_4$, and $MnAl_2O_4$.

The low acoustic velocity film 52 is a film in which the acoustic velocity of a bulk wave in the low acoustic velocity film 52 is lower than the acoustic velocity of a bulk wave propagating in the piezoelectric film 53, and is located between the piezoelectric film 53 and the high acoustic velocity support substrate 51. With the structure and the properties that energy of an acoustic wave is concentrated on a medium having a low acoustic velocity, a leakage of surface acoustic wave energy out from the piezoelectric film 53 is reduced or prevented. As a material of the low acoustic velocity film 52, for example, a dielectric such as a compound obtained by adding fluorine, carbon, or boron to glass, silicon oxide, silicon oxynitride, lithium oxide, tantalum oxide, and silicon oxide, or a material that includes the above-described materials as the main components can be used.

According to the above-described laminated structure of the piezoelectric substrate 50, a Q value in a resonant frequency and an anti-resonant frequency can be significantly increased, compared to a structure in the related art in which the single-layer piezoelectric substrate is used. That is, since the acoustic wave resonator having a great Q value can be configured, a filter having a small insertion loss can be configured by using the acoustic wave resonator.

The high acoustic velocity support substrate 51 may have a structure in which a support substrate and a high acoustic velocity film are laminated. The acoustic velocity of the bulk wave propagating in the high acoustic velocity film is higher than that of the acoustic wave, such as the surface acoustic wave or a boundary acoustic wave, propagating in the piezoelectric film 53. In this case, the high acoustic velocity film is located between the support substrate and the low acoustic velocity film 52. As the material for the high acoustic velocity film, the same material as the material of the high acoustic velocity support substrate 51 can be used. As a material of the support substrate, for example, a piezoelectric body such as aluminum nitride, lithium tantalate, lithium niobate, and quartz, ceramic such as alumina, sapphire, magnesia, silicon nitride, silicon carbide, zirconia, cordierite, mullite, steatite, and forsterite, a dielectric such as diamond and glass, a semiconductor such as silicon and gallium nitride, or a resin, and alternatively, a material that includes the above-described materials as the main components can be used.

In the present specification, the phrase “main component of the material” means a component in which a ratio occupied by the material exceeds 50% by weight. The main component may exist in any one state of single crystal, polycrystal, and amorphous, or in a mixed state thereof.

In addition, the piezoelectric substrate on which the IDT electrode 54 is provided may have a structure in which the support substrate, an confinement energy layer, and the piezoelectric film are laminated in this order. The IDT electrode 54 is provided on the piezoelectric film. As the piezoelectric film, for example, the $LiTaO_3$ piezoelectric single crystal or the piezoelectric ceramics is used. The support substrate supports the piezoelectric film, the energy confinement layer, and the IDT electrode 54.

The energy confinement layer includes one layer or a plurality of layers, and the velocity of the bulk acoustic wave propagating in the at least one layer is higher than the velocity of the acoustic wave propagating in the vicinity of the piezoelectric film. For example, the energy confinement layer may have a laminated structure of a low acoustic velocity film and a high acoustic velocity film. The low acoustic velocity film is a film in which the acoustic velocity of the bulk wave in the low acoustic velocity film is lower than the acoustic velocity of the acoustic wave propagating in the piezoelectric film. The high acoustic velocity film is a film in which the acoustic velocity of the bulk wave in the high acoustic velocity film is higher than the acoustic velocity of the acoustic wave propagating in the piezoelectric film. The support substrate may be a high acoustic velocity film.

In addition, the energy confinement layer may be an acoustic impedance layer having a configuration in which a low acoustic impedance layer having a relatively low acoustic impedance and a high acoustic impedance layer having a relatively high acoustic impedance are alternately laminated.

Here, electrode parameters of the IDT electrode defining the acoustic wave resonator 60 will be described.

A wavelength of the acoustic wave resonator 60 is defined by a wavelength $\lambda$ that is a repeating period in the plurality of electrode fingers 61*a* or 61*b* defining the IDT electrode 54 illustrated in (b) of FIG. 3. In addition, the wavelength $\lambda$ is twice an electrode finger pitch that is a distance between the center of the electrode finger 61*a* and the center of the electrode finger 61*b*, the electrode finger 61*a* and the electrode finger 61*b* being adjacent to each other. In addition, in a case where a line width of the electrode fingers 61*a* and 61*b* defining the respective comb electrodes 60*a* and 60*b* is denoted by W, and a space width between the electrode finger 61*a* and the electrode finger 61*b* adjacent to each other is denoted by S, the electrode finger pitch is defined as (W+S). In addition, the duty of the IDT electrode 54 is a line width occupancy ratio of the plurality of electrode fingers 61*a* and 61*b*, is a ratio of the line width with respect to the sum of the line width of the plurality of electrode fingers 61*a* and 61*b* and the space width, and is defined as W/(W+S). In addition, in (b) of FIG. 3, the height of the comb electrodes 60*a* and 60*b* is denoted by h.

In the IDT electrode 54, in a case where an interval between the electrode fingers adjacent to each other is not constant, the electrode finger pitch of the IDT electrode 54 is defined as an average electrode finger pitch of the IDT electrode 54. The average electrode finger pitch of the IDT electrode 54 is defined as Di/(Ni−1), when the total number of the electrode fingers 61*a* and 61*b* included in the IDT electrode 54 is denoted by Ni, and an inter-center distance between the electrode finger located in one end of the IDT electrode 54 and the electrode finger located in the other end in the acoustic wave propagation direction is denoted by Di.

3. Relationship Between Mass Coefficient M and Third Harmonic Excitation

Next, a relationship between the mass coefficient M and a third harmonic excitation response will be described. The inventor of example embodiments of the present invention has firstly defined the mass coefficient M as a parameter having an influence on the resonance characteristics of the acoustic wave resonator and has discovered a strong correlation between the mass coefficient M and the third harmonic excitation response.

Figure 4:
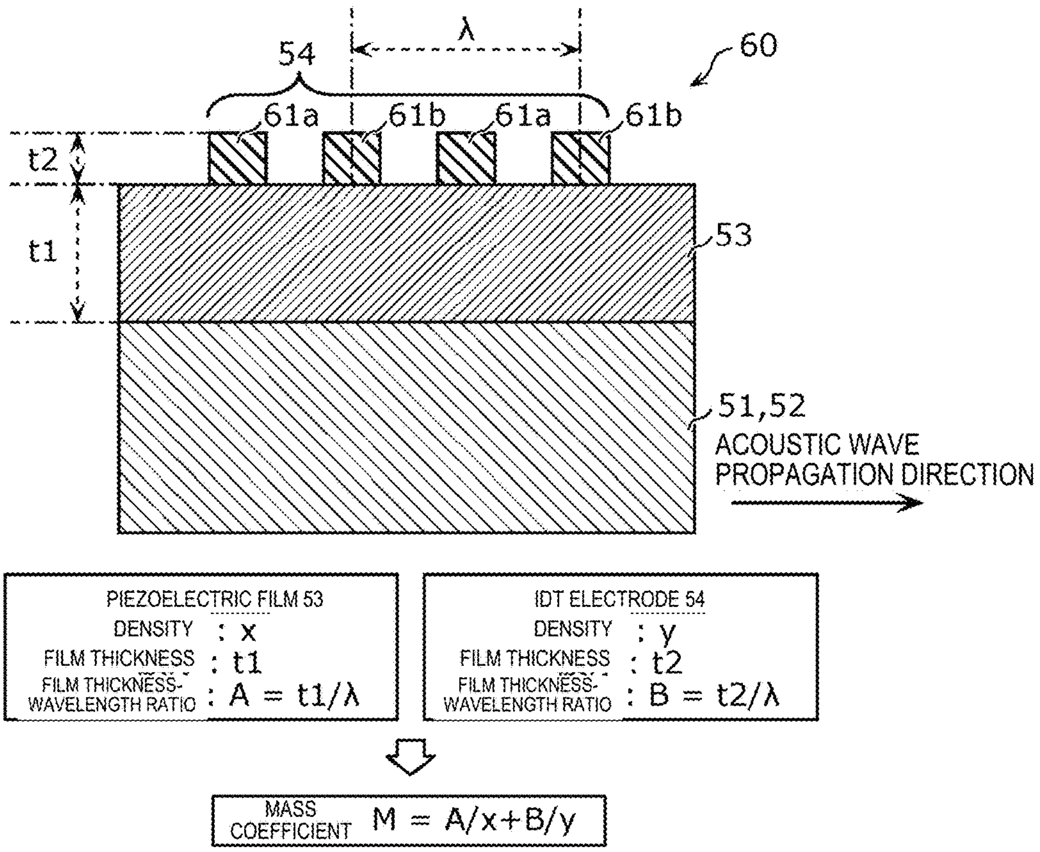
FIG. 4 is a sectional view of an acoustic wave resonator describing a mass coefficient according to an example embodiment of the present invention.

FIG. 4 is a sectional view of the acoustic wave resonator 60 to describe the mass coefficient M. As illustrated in FIG. 4, an electrode finger wavelength that is twice the pitch between a plurality of electrode fingers (electrode fingers 61*a* and 61*b*) that define the IDT electrode 54 and are parallel or substantially parallel to each other is denoted by $\lambda$ (m). In addition, the film thickness of the piezoelectric film 53 is denoted by t1 (m), and the film thickness of the electrode fingers 61*a* and 61*b* is denoted by t2 (m). Further, $t1/\lambda$ is denoted by a film thickness-wavelength ratio A of the piezoelectric film 53, and $t2/\lambda$ is denoted by a film thickness-wavelength ratio B of the IDT electrode 54 (electrode fingers 61*a* and 61*b*). In addition, the density of the piezoelectric film 53 is denoted by x (g/cm$^3$), and the density of the IDT electrode 54 is denoted by y (g/cm$^3$). Here, $(A/x+B/y)$ is defined as the mass coefficient M.

The mass coefficient M is effective as a parameter to optimize the mass distribution of the acoustic wave resonator 60 in a direction perpendicular or substantially perpendicular to the main surface of the piezoelectric substrate 50 by adjusting the film thickness t1 of the piezoelectric film 53 and the film thickness t2 of the IDT electrode 54.

Table 1 shows the structure and parameters of acoustic wave resonators according to an example and a comparative example.

TABLE 1

| | | Example | Comparative Example |
|---|---|---|---|
| IDT Electrode: Al | Electrode Finger Wavelength λ (μm) | 4.25 | ← |
| | Electrode Finger Film Thickness t2 (nm) | 360 | 320 |
| | Electrode Finger Density y (g/cm$^3$) | 2.7 | ← |
| | Electrode Duty | 0.625 | ← |
| Piezoelectric | Piezoelectric Film: $LiTaO_3$ Film Thickness t1 (nm) | 700 | 500 |
| Substrate | Piezoelectric Film: $LiTaO_3$ Density x (g/cm$^3$) | 7.45 | ← |
| | Low Acoustic Velocity Film: $SiO_2$ Film Thickness (nm) | 300 | ← |
| | High Acoustic Velocity Film: SiN Film Thickness (nm) | 300 | ← |
| | Support Substrate: Si Film Thickness (μm) | 125 | ← |
| Film Thickness-Wavelength Ratio A | | 0.16 | 0.12 |
| Film Thickness-Wavelength Ratio B | | 0.085 | 0.075 |
| Mass Coefficient M | | 0.053 | 0.044 |

In Table 1, the mass coefficient M of the acoustic wave resonator according to the example is about 0.053, and the mass coefficient M of the acoustic wave resonator according to the comparative example is about 0.044.

Figure 5:
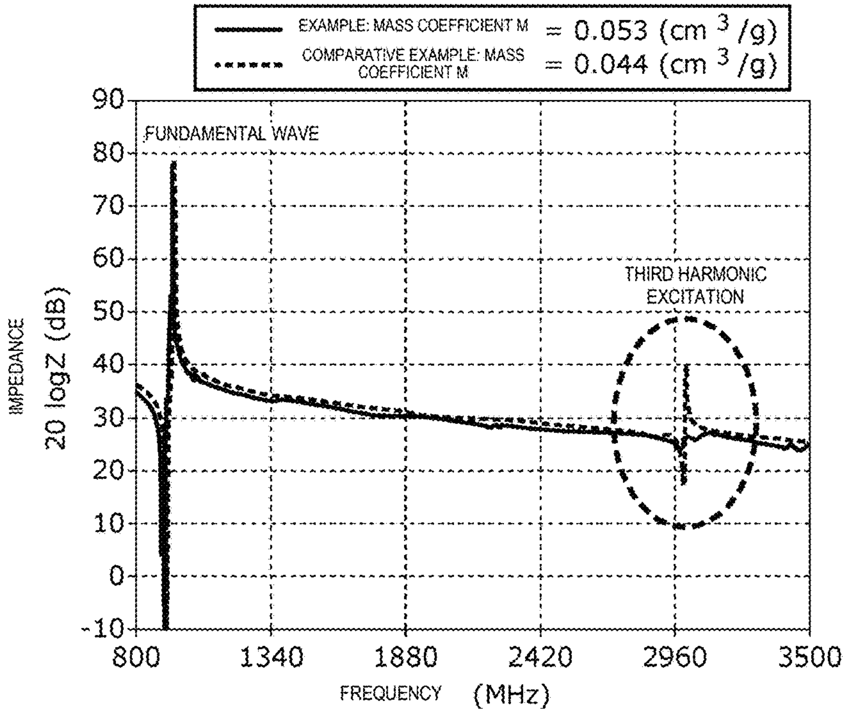
FIG. 5 is a graph illustrating resonance characteristics of acoustic wave resonators according to an example and a comparative example according to the present invention.

FIG. 5 is a graph illustrating the resonance characteristics of the acoustic wave resonators according to the example and the comparative example. As illustrated in FIG. 5, the resonance characteristics (resonant frequency, anti-resonant frequency, and impedance) of the fundamental wave are the same or substantially the same in the acoustic wave resonator according to the example and the acoustic wave resonator according to the comparative example. On the other hand, the intensity (the difference in impedance between the resonant frequency and the anti-resonant frequency) of the third harmonic excitation response of the acoustic wave resonator according to the example is lower than the intensity in the acoustic wave resonator according to the comparative example.

Table 2 shows the phase of a third harmonic excitation signal of the acoustic wave resonator 60 when the film thickness-wavelength ratio A of the piezoelectric film 53 and the film thickness-wavelength ratio B of the IDT electrode 54 are changed. More specifically, Table 2 shows the phase of the third harmonic excitation signal of the acoustic wave resonator 60 when the film thickness t1 of the piezoelectric film 53 and the film thickness t2 of the IDT electrode 54 are changed. Table 2 shows that the larger the phase of the third harmonic excitation signal (close to) +90°, the higher the intensity of the third harmonic excitation signal, and the smaller the phase of the third harmonic excitation signal (close to) −90°, the lower the intensity of the third harmonic excitation signal.

TABLE 2

| Film Thickness-Wavelength | Film Thickness-Wavelength Ratio A t1 (nm) | | | | | |
|---|---|---|---|---|---|---|
| Ratio B t2 (nm) | 0.12500 | 0.14600 | 0.17700 | 0.19800 | 0.22900 | 0.241000 |
| | Phase (°) At Third Harmonic Excitation | | | | | |
| 0.048200 | −15.94 | −0.72 | 21.13 | 24.37 | 6.22 | −33.13 |
| 0.058240 | 7.72 | 15.06 | 12.47 | −3.15 | −32.02 | −45.92 |
| 0.067280 | 29.67 | 21.48 | −0.29 | −23.90 | −59.01 | −46.41 |
| 0.077320 | 30.05 | 4.24 | −34.34 | −64.21 | −58.09 | −45.08 |
| 0.087360 | 26.83 | −23.84 | −71.25 | −57.55 | −34.94 | −18.80 |
| 0.096400 | 18.27 | −57.19 | −53.29 | −38.01 | −24.50 | −10.28 |
| 0.106440 | −40.08 | −40.36 | −24.97 | −29.28 | −11.22 | −18.41 |
| 0.116480 | −9.56 | 3.03 | −4.05 | −20.48 | −11.35 | −36.85 |
| 0.125520 | 24.86 | 4.65 | −2.78 | −9.52 | −0.74 | −18.43 |
| 0.135560 | 24.46 | −11.34 | 8.83 | −2.40 | −1.57 | −5.27 |

In addition, in calculating the film thickness-wavelength ratios A and B in Table 2, the electrode finger wavelength $\lambda$ is about 4.15 (μm). In addition, the density y of the IDT electrode 54 is about 2.7 (g/cm$^3$), the electrode duty is about 0.625, and the density x of the piezoelectric film 53 is about 7.45 (g/cm$^3$). In addition, the material configurations of the IDT electrode 54 and the piezoelectric substrate 50 are the same or substantially the same as the material configurations shown in Table 1.

With Table 2, in a case where the film thickness t1 of the piezoelectric film 53 and the film thickness t2 of the IDT electrode 54 are changed, the combinations of t1 and t2 at which the phase of the third harmonic excitation signal is minimized (bold in Table 2) are different from each other.

Figure 6:
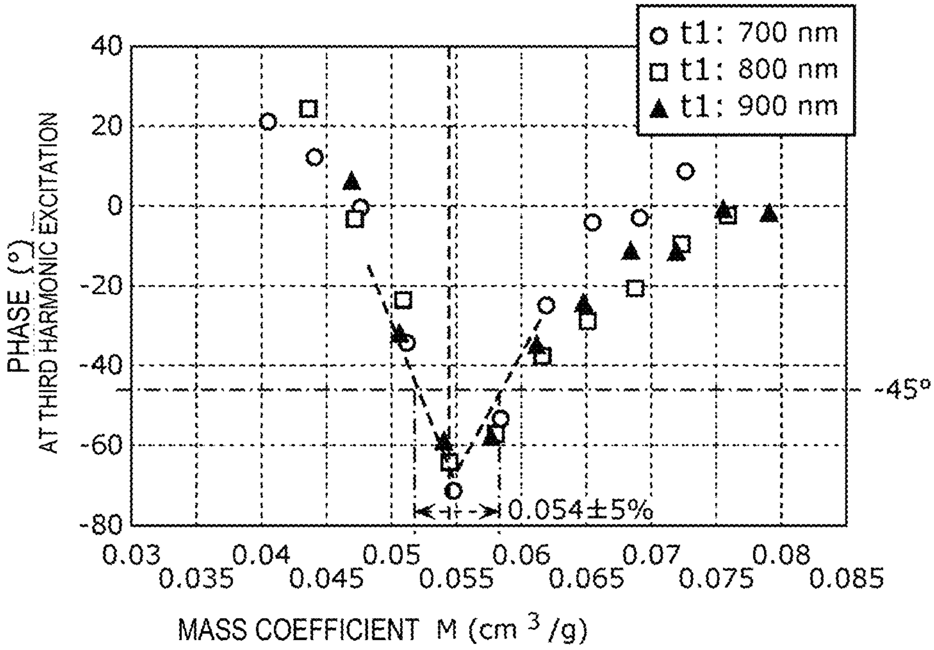
FIG. 6 is a graph illustrating a relationship between the mass coefficient of the acoustic wave resonator and a phase of a third harmonic excitation signal.

FIG. 6 is a graph illustrating a relationship between the mass coefficient M of the acoustic wave resonator and the phase of the third harmonic excitation signal. FIG. 6 illustrates a relationship between the mass coefficient M and the phase of the third harmonic excitation signal in a case where the film thickness t1 of the piezoelectric film 53 is about 700 nm, about 800 nm, and about 900 nm in Table 2. Even though the film thickness t1 of the piezoelectric film 53 is changed, the mass coefficient M is approximately 0.054 in common, thus minimizing the phase of the third harmonic excitation signal.

In addition, the mass coefficient M at which the phase of the third harmonic excitation signal is equal to or less than about −45° is within a range of about 0.054±5%. In other words, the mass coefficient M at which the phase of the third harmonic excitation signal is equal to or less than about −45° is equal to or more than about 0.95×0.054 and equal to or less than about 1.05×0.054.

Accordingly, it is possible to reduce or prevent the deterioration in the characteristics of the filter 10 due to the third harmonic excitation response to a level that is not problematic in practical use.

The acoustic wave resonator according to the present example corresponds to the series arm resonator 11 among the plurality of acoustic wave resonators defining the filter 10 according to the example embodiment. That is, the mass coefficient M of the series arm resonator 11 connected closest to the terminal 111 among the plurality of acoustic wave resonators defining the filter 10 is, for example, equal to or more than about 0.95×0.054 and equal to or less than about 1.05×0.054.

Accordingly, it is possible to effectively reduce or prevent an occurrence of a situation in which the third harmonic excitation signal generated in the filter 10 has an adverse influence on the other filter circuit connected to the filter 10 by the terminal 111. In the multiplexer 1 according to the present example embodiment, for example, it is possible to effectively reduce the return loss at the frequency of the third harmonic excitation generated in the filter 10, and thus it is possible to effectively reduce or prevent the deterioration in the characteristics of the filter 20 at this frequency.

It is understood that this is caused by optimizing the mass distribution of the series arm resonator 11 in the direction perpendicular to the main surface of the piezoelectric substrate 50 by optimizing the mass coefficient M.

In optimizing the mass coefficient M, the film thickness t1 of the piezoelectric film 53 and the film thickness t2 of the IDT electrode 54 are adjusted.

As a first example of the optimization of the mass coefficient M, the film thickness t1 of the piezoelectric film 53 is first optimized in order to adjust the fractional band width (resonance band width) and the higher-order mode of the acoustic wave resonator. By optimizing the film thickness t2 of the IDT electrode 54 in correspondence with the optimized film thickness t1, it is possible to reduce or prevent the third harmonic excitation response along with the adjustment of the fractional band width (resonance band width) and the higher-order mode.

Further, as a second example of the optimization of the mass coefficient M, the film thickness t2 of the IDT electrode 54 is first optimized in order to adjust the stop-band width and the electric power handling capability of the acoustic wave resonator. By optimizing the film thickness t1 of the piezoelectric film 53 in correspondence with the optimized film thickness t2, it is possible to reduce or prevent the third harmonic excitation response along with the adjustment of the stop-band width and the electric power handling capability.

In the case of the filter 10A according to the modified example of the present example embodiment, the mass coefficient M of the series arm resonator 11 connected closest to the terminal 111 among the plurality of acoustic wave resonators defining the filter 10A is, for example, equal to or more than about 0.95×0.054 and equal to or less than about 1.05×0.054.

In the circuit configuration of the filters 10 and 10A, in a case where the acoustic wave resonator connected closest to the terminal 111 is the parallel arm resonator and the series arm resonator, the mass coefficient M of at least one of the parallel arm resonator or the series arm resonator only needs to be equal to or more than about 0.95×0.054 and equal to or less than about 1.05×0.054, for example.

In addition, the acoustic wave resonator according to the present example may correspond to all of the plurality of acoustic wave resonators defining the filter 10 according to the present example embodiment. That is, the mass coefficient M of all the acoustic wave resonators defining the filter 10 may be, for example, equal to or more than about 0.95×0.054 and equal to or less than about 1.05×0.054.

Accordingly, the third harmonic excitation signal generated by each acoustic wave resonator defining the filter 10 is reduced or prevented, so that it is possible to maximally reduce or prevent the third harmonic excitation signal generated from the filter 10.

In addition, in the filter using the acoustic wave resonator, a region where the duty is more than about 0.5 is often used to optimize the bandpass characteristic. However, in the region where the duty is more than about 0.5, the unnecessary waves of the third harmonic excitation tend to increase.

On the other hand, with the filter 10 using the acoustic wave resonator according to the present example, it is possible to reduce or prevent the unnecessary waves of the third harmonic excitation even in the region where the duty is more than 0.5.

In addition, in all of the acoustic wave resonators defining the filter 10, one piezoelectric substrate 50 may be shared.

Accordingly, it is possible to easily set the mass coefficient M of all the acoustic wave resonators defining the filter 10 to be equal to or more than about 0.95×0.054 and equal to or less than about 1.05×0.054. In addition, it is possible to reduce the size of the filter 10.

In addition, the film thickness t2 of the IDT electrode 54 may be the same or substantially the same in all of the acoustic wave resonators defining the filter 10.

Accordingly, it is possible to easily set the mass coefficient M of all the acoustic wave resonators defining the filter 10 to be equal to or more than about 0.95×0.054 and equal to or less than about 1.05×0.054, for example. In addition, it is possible to simplify the manufacturing process of the filter 10.

4. Advantageous Effects

As described above, the filter 10 according to the present example embodiment includes the terminals 111 and 112, and the plurality of acoustic wave resonators connected to the path connecting the terminals 111 and 112. Each of the plurality of acoustic wave resonators includes the IDT electrode 54 located on the substrate having piezoelectricity. The piezoelectric substrate includes the piezoelectric film 53 on a surface of which the IDT electrode 54 is formed, a high acoustic velocity film in which the acoustic velocity of the bulk wave propagating in the high acoustic velocity film is higher than the acoustic velocity of the acoustic wave propagating in the piezoelectric film 53, and the low acoustic velocity film 52 in which the acoustic velocity of the bulk wave propagating in the low acoustic velocity film 52 is lower than the acoustic velocity of the bulk wave propagating in the piezoelectric film 53, the low acoustic velocity film 52 being located between the high acoustic velocity film and the piezoelectric film 53. In a case where the electrode finger wavelength that is twice the pitch between the plurality of electrode fingers parallel to each other in the IDT electrode 54 is denoted by λ (m), the film thickness of the piezoelectric film 53 is denoted by t1 (m), the film thickness of the plurality of electrode fingers is denoted by t2 (m), t1/λ is denoted by the film thickness-wavelength ratio A of the piezoelectric film 53, t2/λ is denoted by the film thickness-wavelength ratio B of the plurality of electrode fingers, the density of the piezoelectric film 53 is denoted by x (g/cm$^3$), the density of the IDT electrode 54 is denoted by y (g/cm$^3$), and (A/x+B/y) is denoted by the mass coefficient M, the mass coefficient M of a first acoustic wave resonator connected closest to the terminal 111 among the plurality of acoustic wave resonators is equal to or more than about 0.95×0.054 and equal to or less than 1.05×0.054, for example.

Accordingly, it is possible to effectively reduce or prevent an occurrence of a situation in which the unnecessary waves of the third harmonic excitation generated in the filter 10 have an adverse influence on the other filter circuit connected to the filter 10 by the terminal 111.

In addition, for example, in the filter 10, the mass coefficient M of each of the plurality of acoustic wave resonators is equal to or more than about 0.95×0.054 and equal to or less than about 1.05×0.054.

Accordingly, the third harmonic excitation signal generated by each acoustic wave resonator defining the filter 10 is reduced or prevented, so that it is possible to maximally reduce or prevent the unnecessary waves of the third harmonic excitation generated from the filter 10.

Further, for example, in the filter 10, the piezoelectric substrate 50 may be shared among the plurality of acoustic wave resonators.

Accordingly, for example, it is possible to easily set the mass coefficient M of all the acoustic wave resonators defining the filter 10 to be equal to or more than about 0.95×0.054 and equal to or less than about 1.05×0.054. In addition, it is possible to reduce the size of the filter 10.

In addition, for example, in the filter 10, the film thickness t2 of the plurality of electrode fingers is the same or substantially the same among the plurality of acoustic wave resonators.

Accordingly, it is possible to easily set the mass coefficient M of all the acoustic wave resonators defining the filter 10 to be equal to or more than about 0.95×0.054 and equal to or less than about 1.05×0.054, for example. In addition, it is possible to simplify the manufacturing process of the filter 10.

In addition, for example, in the filter 10, the piezoelectric film 53 includes, for example, $LiTaO_3$.

In the case of the acoustic wave resonator using the piezoelectric substrate 50 configured with the laminated structure including the piezoelectric film 53 including $LiTaO_3$, the low acoustic velocity film, and the high acoustic velocity film, unnecessary waves of a higher-order mode are likely to be generated. Regarding this, with the above configuration of the filter 10, it is possible to reduce or prevent the unnecessary waves of the third harmonic excitation even in a case using the piezoelectric substrate 50 having the laminated structure.

In addition, for example, in the filter 10, the plurality of acoustic wave resonators include the series arm resonators 11 to 14 provided in series in the path connecting the terminals 111 and 112, and the parallel arm resonators 15 to 18 connected between the path and the ground.

Accordingly, in the ladder filter 10, it is possible to reduce or prevent the unnecessary waves of the third harmonic excitation.

In addition, for example, in the filter 10A, the plurality of acoustic wave resonators include a longitudinally coupled resonator.

Accordingly, in the filter 10A including the longitudinally coupled resonator, it is possible to reduce or prevent the unnecessary waves of the third harmonic excitation.

In addition, for example, the multiplexer 1 according to the present example embodiment includes the common terminal 100, the filter 10 or 10A in which the terminal 111 is connected to the common terminal 100, and the filter 20 connected to the common terminal 100.

Accordingly, it is possible to effectively reduce or prevent the occurrence of a situation in which the third harmonic excitation signal generated in the filter 10 has an adverse influence on the filter 20 through the common terminal 100.

In addition, for example, in the multiplexer 1, the filter 20 includes the acoustic wave resonator and is located on the piezoelectric substrate 50.

Accordingly, it is possible to reduce the size of the multiplexer 1 and to simplify the manufacturing process.

In addition, for example, in the multiplexer 1, the acoustic wave resonator of the filter 20 includes the IDT electrode located on the piezoelectric substrate 50, and the film thickness of the plurality of electrode fingers defining the IDT electrode of the filter 20 is the same as the film thickness of the plurality of electrode fingers defining the IDT electrode of the filter 10.

Accordingly, it is possible to simplify the manufacturing process of the multiplexer 1.

Further, for example, in the multiplexer 1, the filter 20 has a pass band that is located on the higher frequency side than a pass band of the filter 10.

Accordingly, even though the unnecessary waves of the third harmonic excitation generated by the filter 10 are included in the vicinity of the pass band of the filter 20, it is possible to reduce or prevent the deterioration in the band-pass characteristic of the filter 20.

Other Example Embodiments

Hitherto, the acoustic wave device and the multiplexer according to the present invention have been described by describing the above-described example embodiments, the examples, and the modified examples. The present invention is not limited to the above-described example embodiments, examples, and modified examples. The present invention also includes modified examples obtained such that those skilled in the art modify the example embodiment, the examples, and the modified examples in various manners within the scope not departing from the concept of the present invention, or various devices incorporating the acoustic wave device and the multiplexer according to the present invention.

In addition, for example, in the acoustic wave devices and the multiplexers according to the above-described example embodiments, the examples, and the modified examples, matching elements such as an inductor and a capacitor, and a switch circuit may be connected between respective elements.

For example, the resonant frequency and the anti-resonant frequency described in the above-described example embodiments, the examples, and the modified examples are derived by bringing an RF probe into contact with two input/output electrodes of the acoustic wave resonator to measure reflection characteristics.

Example embodiments of the present invention can be widely used as, for example, a transmission and reception filter and a multiplexer used in the front end of a radio communication terminal that requires low loss in the pass band and high attenuation in the non-pass band.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a first input/output terminal and a second input/output terminal; and a plurality of acoustic wave resonators connected to a path connecting the first input/output terminal and the second input/output terminal; wherein each of the plurality of acoustic wave resonators includes an interdigital transducer (IDT) electrode on a substrate having piezoelectricity;

the substrate includes:

a piezoelectric film on a surface of which the IDT electrode is formed;

a high acoustic velocity film in which an acoustic velocity of a bulk wave propagating in the high acoustic velocity film is higher than an acoustic velocity of an acoustic wave propagating in the piezoelectric film; and a low acoustic velocity film in which an acoustic velocity of a bulk wave propagating in the low acoustic velocity film is lower than an acoustic velocity of a bulk wave propagating in the piezoelectric film, the low acoustic velocity film being located between the high acoustic velocity film and the piezoelectric film; and in a case where an electrode finger wavelength that is about twice a pitch between a plurality of electrode fingers parallel or substantially parallel to each other in the IDT electrode is denoted by $\lambda$ (m), a film thickness of the piezoelectric film is denoted by t1 (m), a film thickness of the plurality of electrode fingers is denoted by t2 (m), $t1/\lambda$ is denoted by a film thickness-wavelength ratio A of the piezoelectric film, $t2/\lambda$ is denoted by a film thickness-wavelength ratio B of the plurality of electrode fingers, a density of the piezoelectric film is denoted by x ($g/cm^3$), a density of the IDT electrode is denoted by y ($g/cm^3$), and (A/x+B/y) is denoted by a mass coefficient M, a mass coefficient M of an acoustic wave resonator connected closest to the first input/output terminal among the plurality of acoustic wave resonators is equal to or more than about $0.95\times0.054$ and equal to or less than about $1.05\times0.054$.

2. The acoustic wave device according to claim 1, wherein a mass coefficient M of each of the plurality of acoustic wave resonators is equal to or more than about $0.95\times0.054$ and equal to or less than about $1.05\times0.054$.

3. The acoustic wave device according to claim 1, wherein the substrate is shared among the plurality of acoustic wave resonators.

4. The acoustic wave device according to claim 1, wherein the film thickness t2 of the plurality of electrode fingers is the same or substantially the same among the plurality of acoustic wave resonators.

5. The acoustic wave device according to claim 1, wherein the piezoelectric film includes $LiTaO_3$.

6. The acoustic wave device according to claim 1, wherein the plurality of acoustic wave resonators include:

a series arm resonator provided in series in the path connecting the first input/output terminal and the second input/output terminal; and a parallel arm resonator connected between the path and ground.

7. The acoustic wave device according to claim 1, wherein the plurality of acoustic wave resonators include a longitudinally coupled resonator.

8. A multiplexer comprising:

a common terminal;

the acoustic wave device according to claim 1, in which the first input/output terminal is connected to the common terminal; and a filter connected to the common terminal.

9. The multiplexer according to claim 8, wherein the filter includes an additional acoustic wave resonator and is located on the substrate.

10. The multiplexer according to claim 9, wherein the additional acoustic wave resonator of the filter includes an IDT electrode on the substrate; and a film thickness of a plurality of electrode fingers defining the IDT electrode of the filter is the same or substantially the same as a film thickness of a plurality of electrode fingers defining the IDT electrode of the acoustic wave device.

11. The multiplexer according to claim 8, wherein the filter has a pass band located on a higher frequency side from a pass band of the acoustic wave device.

12. An acoustic wave device comprising:

a first input/output terminal and a second input/output terminal; and a plurality of acoustic wave resonators connected to a path connecting the first input/output terminal and the second input/output terminal; wherein each of the plurality of acoustic wave resonators includes an interdigital transducer (IDT) electrode on a substrate having piezoelectricity;

the substrate includes:

a piezoelectric film on a surface of which the IDT electrode is provided;

a high acoustic velocity film made of at least one of aluminum nitride, lithium tantalate, lithium niobate, quartz, alumina, sapphire, magnesia, silicon nitride, silicon carbide, zirconia, cordierite, mullite, steatite, forsterite, spinel, sialon, aluminum oxide, silicon oxynitride, diamond-like carbon, diamond, and silicon, or made of a material which includes any one of aluminum nitride, lithium tantalate, lithium niobate, quartz, alumina, sapphire, magnesia, silicon nitride, silicon carbide, zirconia, cordierite, mullite, steatite, forsterite, spinel, sialon, aluminum oxide, silicon oxynitride, diamond-like carbon, diamond, and silicon as a main component; and a low acoustic velocity film located between the high acoustic velocity film and the piezoelectric film and made of any one of glass, silicon oxide, silicon oxynitride, lithium oxide, and tantalum oxide, or made of a material which includes any one of glass, silicon oxide, silicon oxynitride, lithium oxide, and tantalum oxide as a main component; and in a case where an electrode finger wavelength that is about twice a pitch between a plurality of electrode fingers parallel or substantially parallel to each other in the IDT electrode is denoted by $\lambda$ (m), a film thickness of the piezoelectric film is denoted by t1 (m), a film thickness of the plurality of electrode fingers is denoted by t2 (m), t1/A is denoted by a film thickness-wavelength ratio A of the piezoelectric film, t2/A is denoted by a film thickness-wavelength ratio B of the plurality of electrode fingers, a density of the piezoelectric film is denoted by x (g/cm$^3$), a density of the IDT electrode is denoted by y (g/cm$^3$), and (A/x+B/y) is denoted by a mass coefficient M, a mass coefficient M of an acoustic wave resonator connected closest to the first input/output terminal among the plurality of acoustic wave resonators is equal to or more than about 0.95×0.054 and equal to or less than about 1.05×0.054.

13. The acoustic wave device according to claim 1, wherein the plurality of acoustic wave resonators include series arm resonators and parallel arm resonators.

14. The acoustic wave device according to claim 1, wherein an adhesion layer is provided between the plurality of acoustic wave resonators and the substrate.

* * * * *